(12) United States Patent
Gietler et al.

(10) Patent No.: US 8,378,491 B2
(45) Date of Patent: Feb. 19, 2013

(54) INTEGRATED CIRCUIT INCLUDING INTERCONNECT LEVELS

(75) Inventors: Herbert Gietler, Villach (AT); Gerhard Zojer, Schiefling am See (AT); Benjamin Finke, Schiefling am See (AT)

(73) Assignee: Infineon Technologies AG, Neubiberg (DE)

( * ) Notice: Subject to any disclaimer, the term of this patent is extended or adjusted under 35 U.S.C. 154(b) by 59 days.

(21) Appl. No.: 12/861,877

(22) Filed: Aug. 24, 2010

(65) Prior Publication Data

US 2012/0049373 A1 Mar. 1, 2012

(51) Int. Cl.
*H01L 23/48* (2006.01)
*H01L 23/52* (2006.01)
*H01L 29/40* (2006.01)

(52) U.S. Cl. ................ 257/758; 257/E23.145

(58) Field of Classification Search .................. 257/758, 257/E23.145
See application file for complete search history.

(56) References Cited

U.S. PATENT DOCUMENTS 5,949,098 A * 9/1999 Mori .............................. 257/211
6,794,674 B2 * 9/2004 Kusumoto .................... 327/524

* cited by examiner

*Primary Examiner* — Phat X Cao
(74) *Attorney, Agent, or Firm* — Murphy, Bilak & Homiller, PLLC

(57) ABSTRACT

An integrated circuit as described herein includes an upper interconnect level including a continuous upper interconnect area, the continuous upper interconnect area including a plurality of upper contact openings. The integrated circuit further includes a lower interconnect level including a continuous lower interconnect area, the continuous lower interconnect area including a plurality of lower contact openings. First contacts extend through the lower contact openings to the upper interconnect area and second contact openings extend through the upper contact openings to the lower interconnect area.

16 Claims, 6 Drawing Sheets

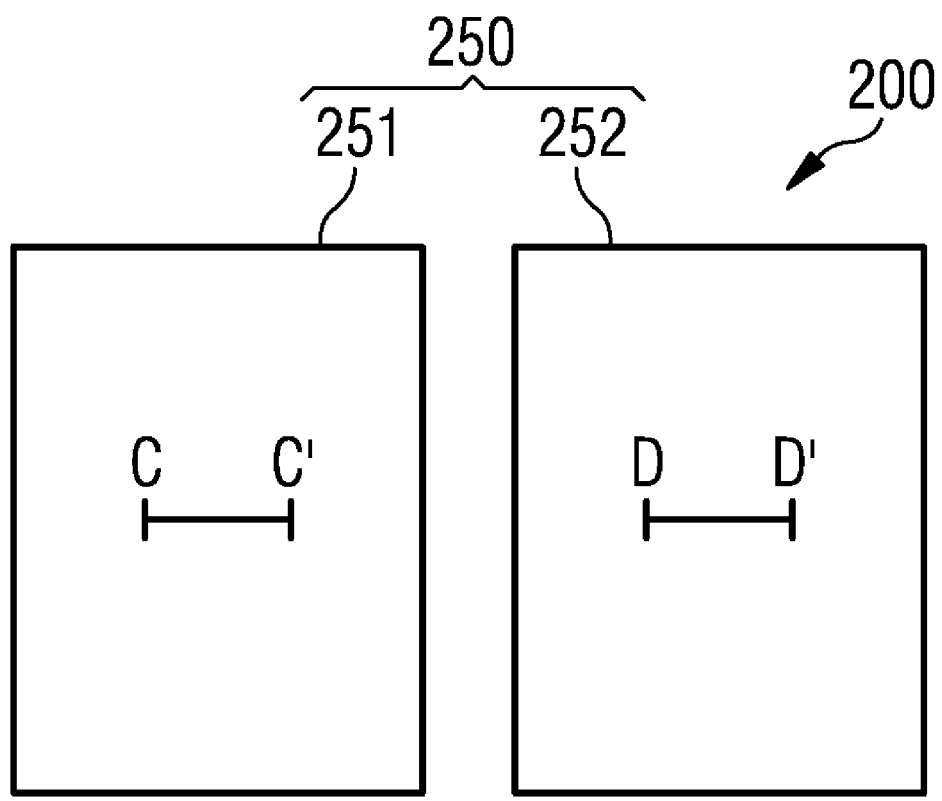

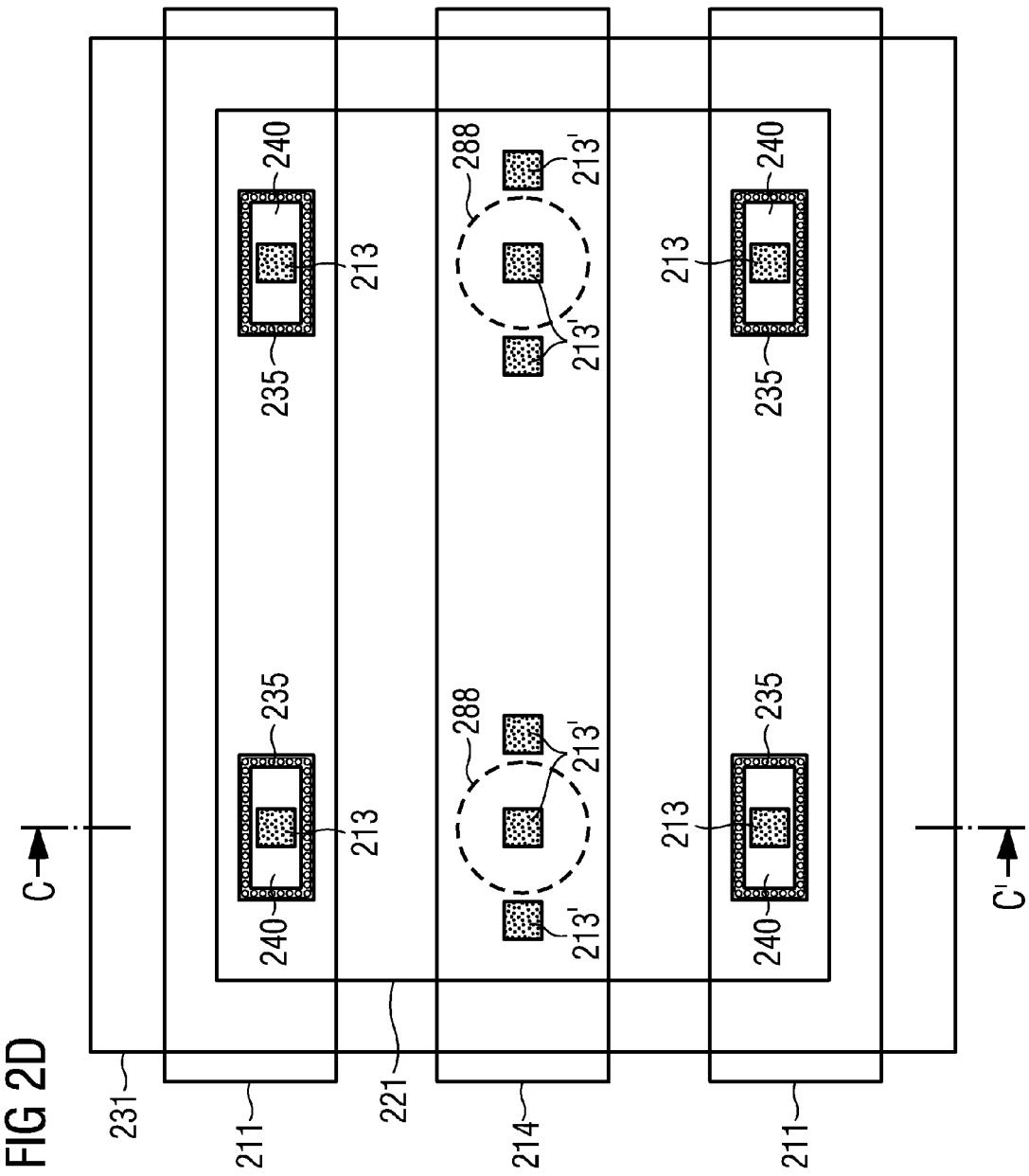

INTEGRATED CIRCUIT INCLUDING INTERCONNECT LEVELS

BACKGROUND OF THE INVENTION

In an integrated circuit a current typically flows from an external pin such as a battery pin into a semiconductor device terminal such as a drain of a Field Effect Transistor (FET) via a connection path within a wiring area, e.g. via connecting wires of the interconnect levels electrically coupled by contact vias.

In semiconductor power device applications large currents have to be directed from external pins to semiconductor device terminals via the interconnect levels. To meet the requirements of reliability and power dissipation capability of semiconductor power devices, a need exists for an interconnect level design to meet those requirements.

For these and other reasons there is a need for the present invention.

SUMMARY

According to an embodiment of an integrated circuit, the integrated circuit includes an upper interconnect level including a continuous upper interconnect area, the continuous upper interconnect area including a plurality of upper contact openings. The integrated circuit further includes a lower interconnect level including a continuous lower interconnect area, the continuous lower interconnect area including a plurality of lower contact openings. First contacts extend through the lower contact openings to the upper interconnect area and second contacts extend through the upper contact openings to the lower interconnect area.

According to another embodiment of an integrated circuit, the integrated circuit includes at least first, second, third and fourth interconnect levels. The first interconnect level includes a plurality of first interconnect areas electrically coupled to a first terminal of a semiconductor device formed within a semiconductor substrate and further includes a plurality of second interconnect areas electrically coupled to a second terminal of the semiconductor device. The second interconnect level includes a third interconnect area, the third interconnect area including a plurality of first openings. The third interconnect level includes a fourth interconnect area, the fourth interconnect area including a plurality of second openings. The fourth interconnect level includes a first contact area and a second contact area, the first contact area being electrically coupled to the first interconnect areas of the first interconnect level via the fourth interconnect area and first contacts extending through the plurality of first openings in the third interconnect area, the second contact area being electrically coupled to the second interconnect areas of the first interconnect level via the third interconnect area and second contacts extending through the plurality of second openings in the fourth interconnect area.

Those skilled in the art will recognize additional features and advantages upon reading the following detailed description and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Features and advantages of embodiments will be apparent from the following description with reference to the accompanying drawings. The drawings are not necessarily to scale and emphasis is placed upon illustrating the principles. The features of the various illustrated embodiments can be combined in any way unless they exclude each other.

FIG. 2A illustrates a schematic top view of a portion of an integrated circuit including a fourth interconnect level according to another embodiment.

FIG. 2D illustrates a schematic top view of the portion of the integrated circuit illustrated in FIG. 2B.

DETAILED DESCRIPTION

Figure 1A:
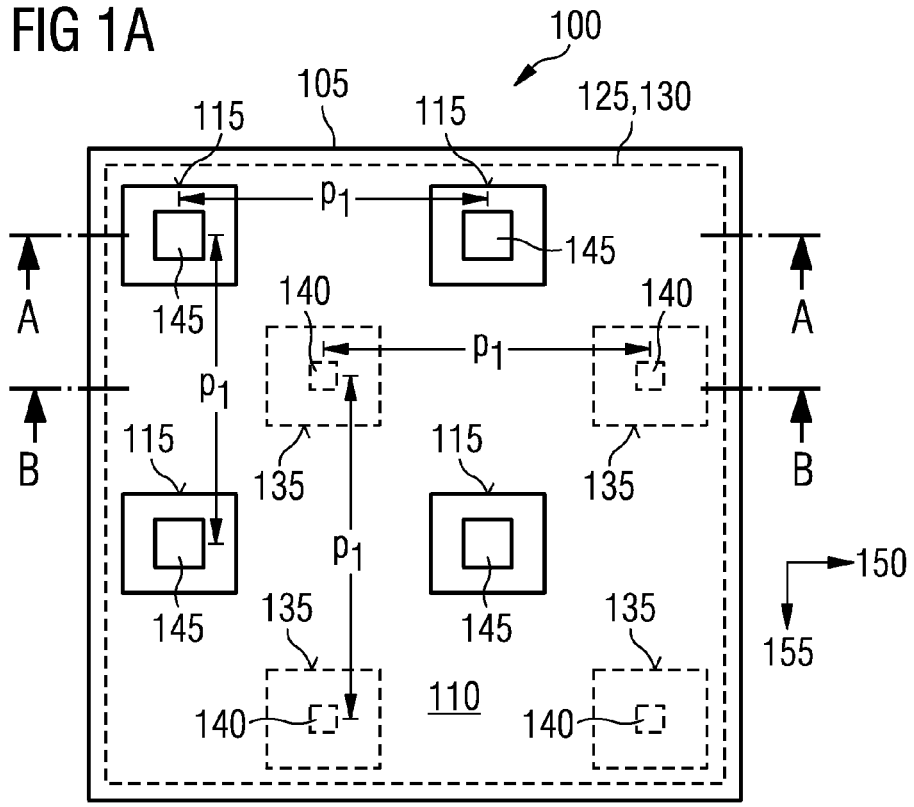
FIG. 1A illustrates a top view of a portion of an upper interconnect level and a lower interconnect level of an integrated circuit according to an embodiment.

FIG. 1A illustrates a top view of a portion of an upper interconnect level 105 of an integrated circuit 100 according to an embodiment. The upper interconnect level 105 includes a continuous upper interconnect area 110. The upper interconnect area 110 includes a plurality of contact openings 115 therein.

The integrated circuit 100 further includes a lower interconnect level 125 schematically illustrated by dashed lines. The upper interconnect level 105 and the lower interconnect level 125 are superposed in the schematic illustration of FIG. 1A. For a better distinguishability between illustrated elements associated with the upper interconnect level 105 and illustrated elements associated with the lower interconnect level 125, dashed lines are used to illustrate the elements associated with the lower interconnect level 125 and continuous lines are used to illustrate the elements associated with the upper interconnect level 105.

The lower interconnect level 125 includes a continuous lower interconnect area 130. The lower interconnect area 130 includes a plurality of lower contact openings 135 formed therein.

First contacts 140 extend through the lower contact openings 135 to the upper interconnect area 110. Second contacts 145 extend through the upper contact openings 115 to the lower interconnect area 130.

According to one embodiment, each one of the first contacts 140 is electrically insulated from the lower interconnect area 130 and includes a part formed of a material of the lower interconnect level 125. Likewise, each one of the second contacts 145 is electrically insulated from the upper interconnect area 110 and includes a part formed of the material of the upper interconnect level 105.

According to one embodiment, each one of the second contacts 145 is electrically coupled to a contact area arranged above the upper interconnect level 105, a thickness of the contact area being at least 5 to 30 times larger than the thickness of the lower interconnect level 125 (not illustrated in FIG. 1A). As an example, the contact area may be formed by patterning a power metallization layer such as a Cu layer.

As used herein, the term "electrically coupled" is not meant to mean that the elements must be directly coupled together, but intervening elements may be provided between the "electrically coupled" elements.

According to an embodiment, the power metallization layer may have a thickness between 3 µm and 50 µm.

According to another embodiment, the upper interconnect area 110 is electrically coupled to a plurality of first conductive lines of an interconnect level arranged below the lower interconnect level 125 and the lower interconnect area 130 is electrically coupled to a plurality of second conductive lines of the interconnect level arranged below the lower interconnect level 125, the first and second conductive lines being alternately arranged. As an example, the first conductive lines may be electrically coupled to one terminal of a semiconductor device such as a source/drain terminal of a FET, e.g. a Metal Oxide Semiconductor FET (MOSFET), a lateral double-diffused MOSFET (lateral DMOS), a vertical DMOS, an Insulated Gate Bipolar Transistor (IGBT), or a cathode/anode terminal of a diode such as an ESD (Electrostactic Discharge) protection device and the second conductive lines may be electrically coupled to a second terminal of the semiconductor device such as the other one of the source/drain terminal of the FET or the other one of the anode/cathode terminal of the diode.

According to one embodiment, the lower contact openings 135 and the upper contact openings 115 are arranged in offset patterns. In the embodiment illustrated in FIG. 1A, a pattern of the upper contact openings 115 corresponds to the pattern of the lower contact openings 135 but is offset thereto. In the pattern used for illustration purposes in FIG. 1A, the upper contact openings 115 are regularly arranged to one another, a pitch $p_1$ of the upper contact openings 115 along a first lateral direction 150 being equal to the pitch $p_1$ of the upper contact openings 115 along a second lateral direction 155 that is perpendicular to the first lateral direction 150. Likewise, a pitch of the lower contact openings 135 along the first lateral direction 150 corresponds to the pitch of the lower contact openings 135 along the second lateral direction 155, the pitch being equal to the pitch $p_1$ between the upper contact openings 115. It is to be noted that the patterns of upper and lower contact openings 115, 135 of FIG. 1A serve for illustration purposes only. Patterns of upper and lower contact openings different from the ones illustrated in FIG. 1A may be used. The pattern of the upper contact openings may also differ from the pattern of the lower contact openings, e.g. the upper interconnect area 110 may include more or less contact openings than the lower interconnect area 130. Also the shapes of the upper and lower contact openings may differ from the square shapes of FIG. 1A which serve for illustration purposes only.

Figure 1B:
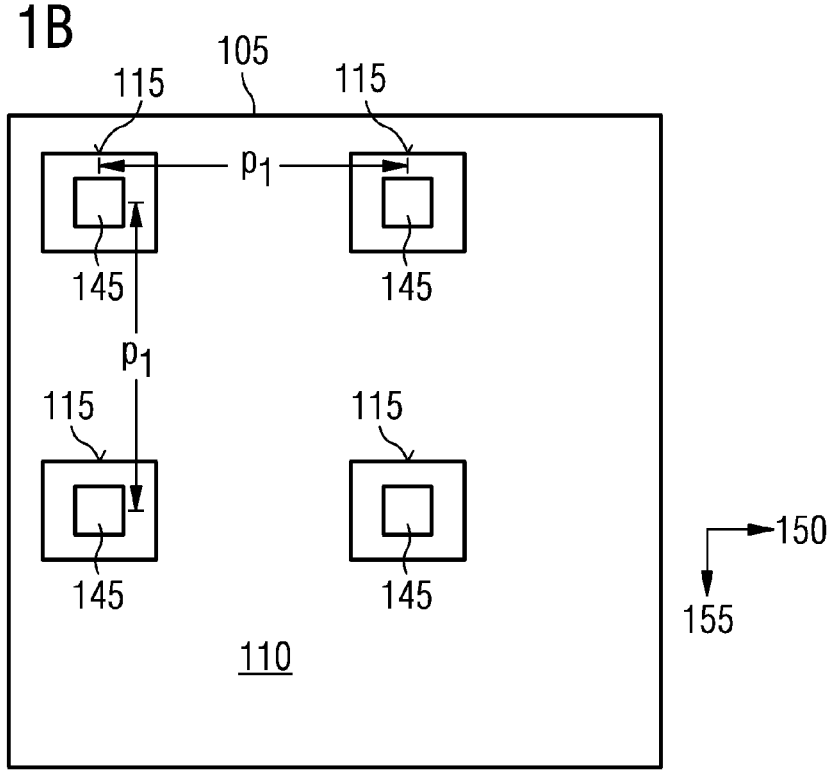
FIG. 1B illustrates a top view of the upper interconnect level of FIG. 1A.

FIG. 1B illustrates a top view of the upper interconnect level 105 of FIG. 1A including the upper contact openings 115 and the second contacts 145 penetrating through the upper interconnect area 110.

Figure 1C:
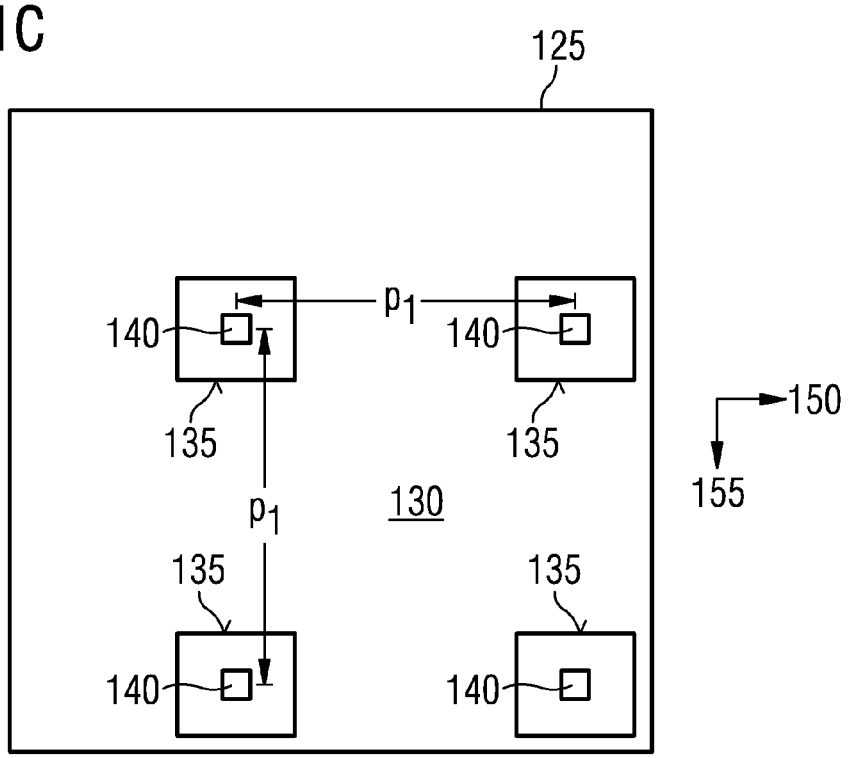
FIG. 1C illustrates a top view of the lower interconnect level of FIG. 1A.

FIG. 1C illustrates a top view of the portion of the lower interconnect level 125 of FIG. 1A including the lower contact openings 135 and the first contacts 140 penetrating through the lower interconnect area 130.

Figure 1D:
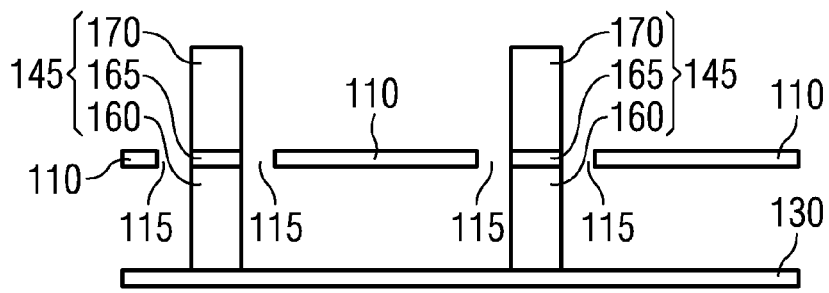
FIG. 1D illustrates a cross-section along line A-A' of FIG. 1A.

FIG. 1D illustrates a cross-section along line AA' of FIG. 1A. A bottom side of the second contacts 145 is in electrical contact with the lower interconnect area 130. Each one of the second contacts 145 extending through the upper contact openings 115 in the upper interconnect area 110 includes three parts. A bottom part 160 between the lower interconnect area 130 and the upper interconnect area 110, a central part 165 being a part of the upper interconnect level 105 and a top part 170 on the central part 165. The top part 170 is in electrical contact with an interconnect area arranged above the upper interconnect area 110. As an example, the top part 170 may be in electrical contact with a power metal contact area. Both the top part and the lower part include conductive materials such as W, Al, Ti, AlSiCu for example.

Figure 1E:
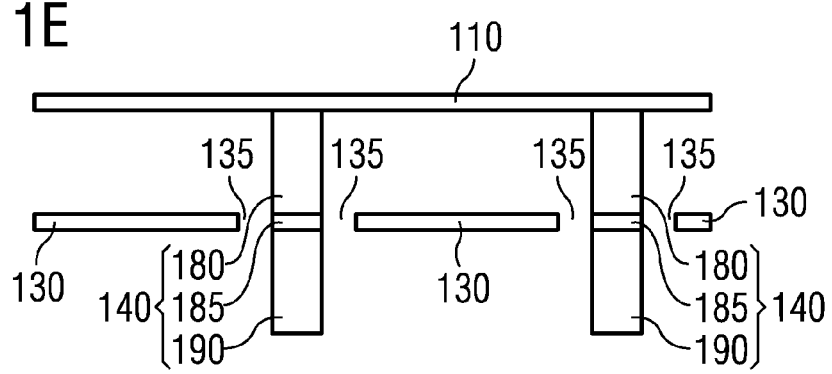
FIG. 1E illustrates a cross-section along line B-B' of FIG. 1A.

FIG. 1E illustrates a cross-section along line BB' of FIG. 1A. A top side of the first contacts 140 is in electrical contact with the upper interconnect area 110. Each one of the first contacts 140 extending through the lower contact openings 135 in the lower interconnect area 130 includes three parts. A top part 180 between the lower interconnect area 130 and the upper interconnect area 110, a central part 185 being a part of the lower interconnect level 125 and a bottom part 190 below and in contact with the central part 185. According to one embodiment, the bottom part is in electrical contact with an interconnect level arranged below the lower interconnect area 130, e.g. with metal lines formed in this interconnect level. According to another embodiment, the bottom part is in electrical contact with a terminal of a semiconductor device formed at a surface of a semiconductor substrate, e.g. a source/drain of a FET or a cathode/anode of an ESD protection device.

The bottom part 160 illustrated in FIG. 1D and the top part 180 illustrated in FIG. 1E may be formed simultaneously, i.e. during same manufacturing processes.

A dielectric structure including one or more electrically insulating materials such as $SiO_2$, $Si_3N_4$ is arranged between the elements illustrated in FIGS. 1A-1E and FIGS. 2A-2E (not illustrated in the figures).

The embodiment illustrated in FIGS. 1A-1E and also the embodiment illustrated in FIGS. 2A-2E relate to interconnect level designs allowing to increase reliability and power dissipation capability of semiconductor devices. Current flowing between first terminals and second terminals of the semiconductor devices can be efficiently directed between a semiconductor substrate and external chip pins via the interconnect levels due to reduced loss of metallization area in the interconnect levels available for the respective semiconductor device. Since interconnect areas of the interconnect levels include multiple openings that are filled with dielectric material such as silicon oxide, mechanical stability of the wiring area including the interconnect levels and dielectric interlayers can be improved. As an example, the wiring area can be made less sensitive to mechanical stress imposed thereon, e.g. during chip bonding, and thus deterioration by mechanical stress, e.g. stress induced short circuits, can be counteracted.

FIG. 2A is a top view of a portion of a fourth interconnect level 250 of an integrated circuit 200 according to another embodiment. The fourth interconnect level 250 includes a first contact area 251 and a second contact area 252. In one embodiment, one or multiple bond wires are formed on each one of the first and second contact areas 251, 252. As an example, the first/second contact areas 251, 252 may be contact areas for source/drain or cathode/anode of semiconductor devices formed within a semiconductor substrate of integrated circuit 200. According to one embodiment, the fourth interconnect level is a power interconnect level. The power interconnect level may have a thickness between 3 μm and 50 μm, for example and may be formed of a conductive material including metals or metal alloys such as Cu, Al, AlSiCu for example.

Figure 2B:
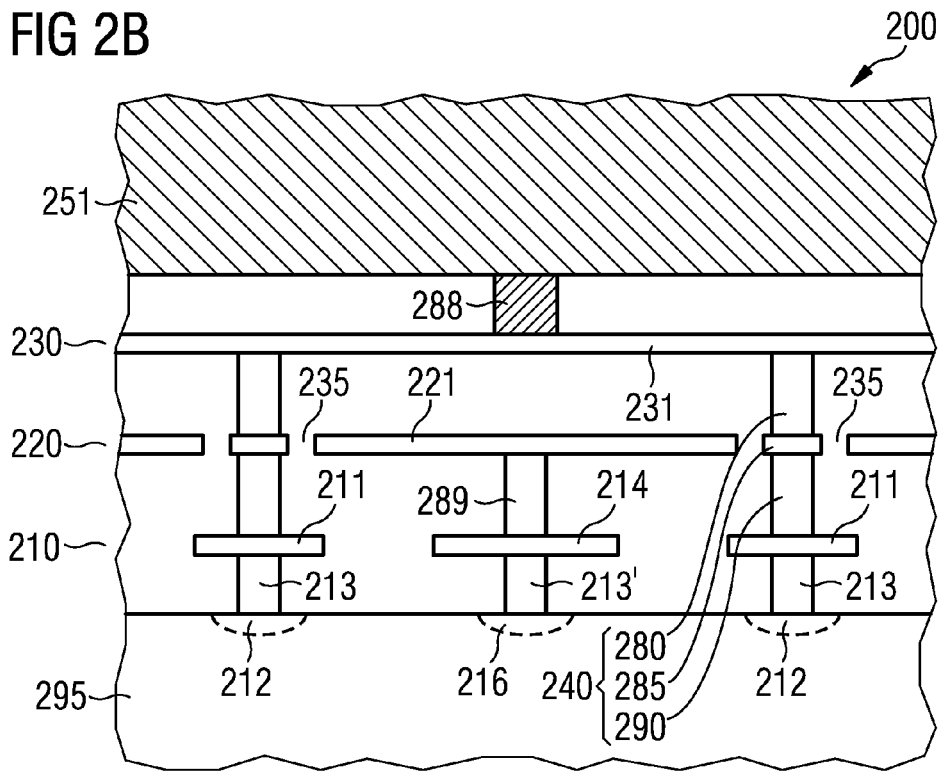
FIG. 2B illustrates a cross-section along line C-C' of FIG. 2A.

FIG. 2B illustrates a cross section along line CC' of the first contact area 251 of integrated circuit 200 illustrated in FIG. 2A.

Integrated circuit 200 further includes first to third interconnect levels 210, 220, 230. The first interconnect level 210 is arranged above a semiconductor substrate 295 such as a silicon semiconductor substrate including semiconductor devices formed by one or a plurality of semiconductor zones such as n-type and p-type semiconductor zones. The second interconnect level 220 is arranged above the first interconnect level 210, the third interconnect level 230 is arranged above the second interconnect level 220 and the fourth interconnect level 250 including the first contact area 251 is arranged above the third interconnect level 230.

The first interconnect level 210 includes a plurality of first interconnect areas 211 electrically coupled to a first terminal 212 of a semiconductor device formed within the semiconductor substrate 295 via lower interlevel contacts 213 such as contact plugs including a conductive material, e.g. W, Al, Ti. According to one embodiment, the first terminal 212 is one of source and drain of a FET such as a MOSFET, a lateral DMOS, a vertical DMOS, an IGBT. According to another embodiment, the first terminal 212 is one of anode and cathode of a diode such as an ESD protection device. According to other embodiments, the first terminal 212 is one terminal of another semiconductor device.

The first interconnect level 210 further includes a plurality of second interconnect areas 214 electrically coupled to a second terminal 216 of the semiconductor device via the lower interlevel contacts 213'. According to one embodiment, the second terminal 216 is the other one of source and drain of a FET such as a MOSFET, a lateral DMOS, a vertical DMOS, an IGBT. According to another embodiment, the second terminal 216 is the other one of anode and cathode of a diode such as an ESD protection device.

The second interconnect level 220 includes a third interconnect area 221. The third interconnect area 221 includes a plurality of first openings 235. The third interconnect area 221 is electrically coupled with the second interconnect areas 214 via contacts 289. Further, the third interconnect level includes a fourth interconnect area 231.

The first contact area 251 is electrically coupled to the first interconnect areas 211 via the fourth interconnect area 231. In particular, first contacts 240 extending through the first openings 235 in the third interconnect area 221 electrically couple the fourth interconnect area 231 and the first interconnect areas 211. A top side of the first contacts 240 is in electrical contact with the fourth interconnect area 231. Each one of the first contacts 240 extending through the first contact openings 235 of the third interconnect area 221 includes three parts. A top part 280 between the third interconnect level 230 and the second interconnect level 220, a central part 285 being a part of the second interconnect level 220 and a bottom part 290 between the first interconnect level 210 and the second interconnect level 220. Both the top part 280 and the bottom part 290 include conductive materials such as W, Al, Ti, AlSiCu for example. The central part 285 and the bottom part 290 may be formed of a same conductive material or a same combination of conductive materials, e.g. in a common processing sequence. The first contact area 251 is electrically coupled to the fourth interconnect area 231 via upper interlevel contacts 288. In the portion of the integrated circuit 200 illustrated in FIG. 2B only one of the upper interlevel contacts 288 is included.

Figure 2C:
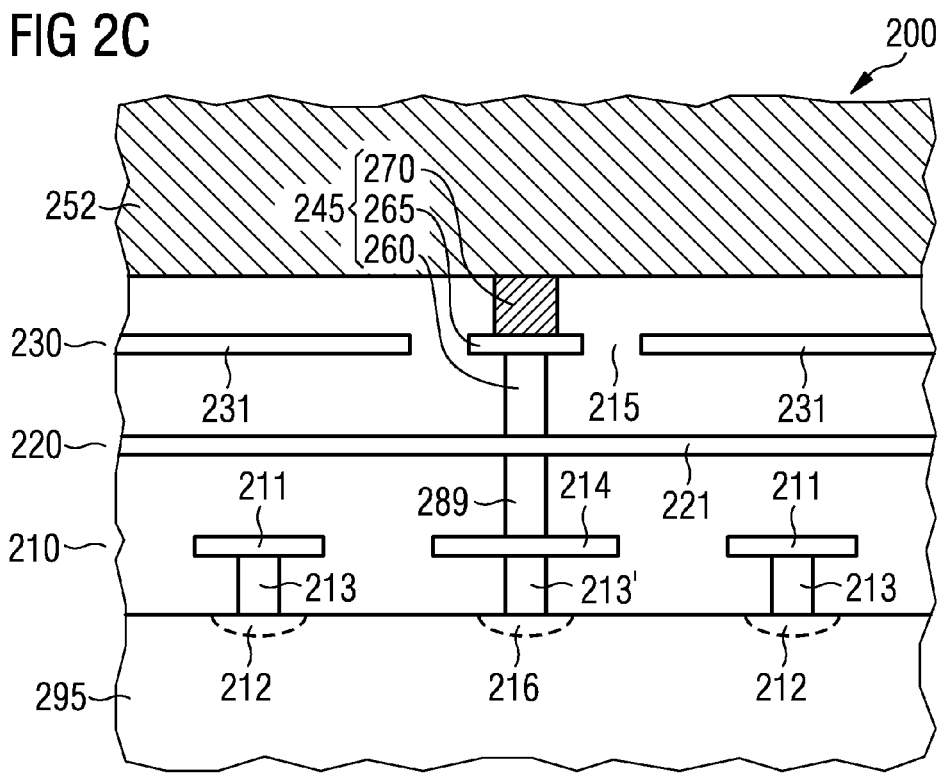
FIG. 2C illustrates a cross-section along line D-D' of FIG. 2A.

FIG. 2C illustrates a cross section along line DD' of the second contact area 252 of integrated circuit 200 illustrated in FIG. 2A.

The fourth interconnect area 231 of the third interconnect level 230 includes a plurality of second openings 215. The second contact area 252 is electrically coupled to the second interconnect areas 214 via the third interconnect area 221. In particular, second contacts 245 extending through the second openings 215 in the fourth interconnect area 231 electrically couple the third interconnect area 221 and the second contact area 252. In the portion of the integrated circuit 200 illustrated in FIG. 2B only one of the second contacts 245 and only one of the second openings 215 is included.

A bottom side of the second contacts 245 is in electrical contact with the third interconnect area 221. Each one of the second contacts 245 extending through the second openings 215 of the fourth interconnect area 231 includes three parts. A bottom part 260 between the second interconnect level 220 and the third interconnect level 230, a central part 265 being a part of the third interconnect level 230 and a top part 270 between the third interconnect level 230 and the second contact area 252. Both the top part 270 and the bottom part 260 include conductive materials such as W, Al, Ti, AlSiCu for example. The top part 270 is formed of a same material or a same combination of materials as the upper interlevel contacts 288 illustrated in FIG. 2B. The central part 265 and the bottom part 260 may be formed of a same conductive material or a same combination of conductive materials, e.g. in a common processing sequence. The third interconnect area 221 is electrically coupled to the second interconnect areas 214 via the contacts 289. The contacts 289 are formed of a same material or a same combination of materials as the bottom part 290 of the first contacts 240 illustrated in FIG. 2B. The contacts 289 and the bottom part 290 may be formed simultaneously, i.e. by same manufacturing processes.

FIG. 2D illustrates a schematic top view of the portion of the integrated circuit 200 illustrated in FIG. 2B. For illustration purposes, a plurality of levels are superposed.

Through the first openings 235 in the third interconnect area 221, the first contacts 240 electrically couple the fourth interconnect area 231 and the first interconnect areas 211. The first contact area 251 (not illustrated in FIG. 2D) is electrically coupled with the fourth interconnect area 231 via the upper interlevel contact 288. The first terminals 212 (not illustrated in FIG. 2D) are electrically coupled with the first interconnect areas 211 via the lower interlevel contacts 213. The second terminals 216 (not illustrated in FIG. 2D) are electrically coupled with the second interconnect areas 214 via the lower interlevel contacts 213'.

Figure 2E:
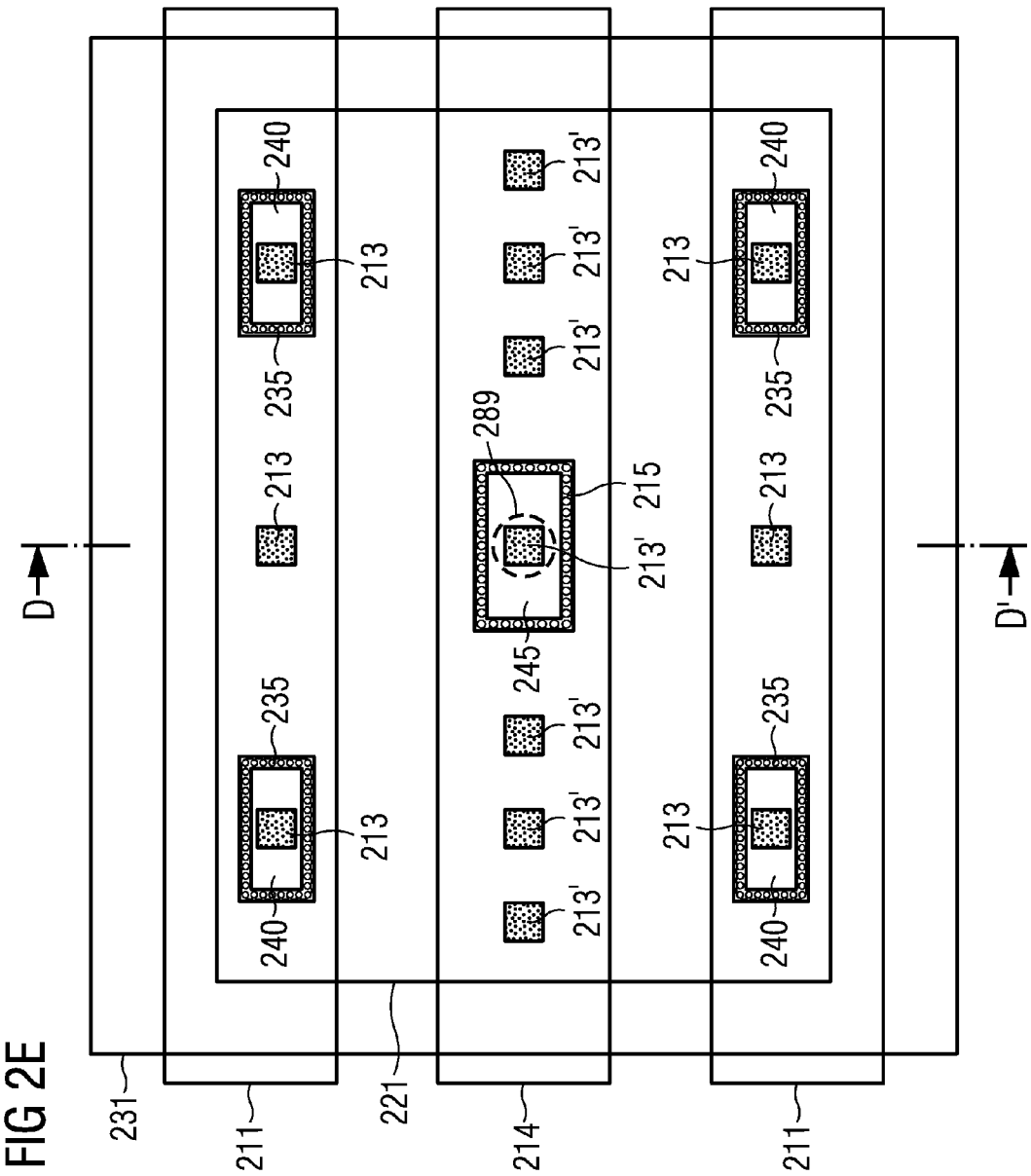
FIG. 2E illustrates a schematic top view of the portion of the integrated circuit illustrated in FIG. 2C.

FIG. 2E illustrates a schematic top view of the portion of the integrated circuit 200 illustrated in FIG. 2C. For illustration purposes, a plurality of levels are superposed.

Through the first openings 235 in the third interconnect area 221, the first contacts 240 electrically couple the fourth interconnect area 231 and the first interconnect areas 211. The first terminals 212 (not illustrated in FIG. 2D) are electrically coupled with the first interconnect areas 211 via the lower interlevel contacts 213. The second contact area 252 (not illustrated in FIG. 2E) is electrically coupled with the third interconnect area 221 via the second contacts 245 extending through the second openings 215 formed in the fourth interconnect area 231. The third interconnect area 221 is electrically coupled with the second interconnect areas 214 via the contacts 289. The second terminals 216 (not illustrated in FIG. 2E) are electrically coupled with the second interconnect areas 214 via the lower interlevel contacts 213'.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
at least first, second, third and fourth interconnect levels; wherein
the first interconnect level includes a plurality of first interconnect areas electrically coupled to a first terminal of a semiconductor device formed within a semiconductor substrate and further includes a plurality of second interconnect areas electrically coupled to a second terminal of the semiconductor device;
the second interconnect level includes a third interconnect area, the third interconnect area including a plurality of first openings;
the third interconnect level includes a fourth interconnect area, the fourth interconnect area including a plurality of second openings;
the fourth interconnect level includes a first contact area and a second contact area, the first contact area being electrically coupled to the first interconnect areas of the first interconnect level via the fourth interconnect area and first contacts extending through the plurality of first openings in the third interconnect area, the second contact area being electrically coupled to the second interconnect areas of the first interconnect level via the third interconnect area and second contacts extending through the plurality of second openings in the fourth interconnect area.

2. The integrated circuit of claim 1, wherein the first interconnect areas include first metal lines extending in parallel to one another and the second interconnect areas include second metal lines extending in parallel to one another, the first and second metal lines being alternately arranged to one another.

3. The integrated circuit of claim 1, further comprising a first bond wire on the first contact area and a second bond wire on the second contact area.

4. The integrated circuit of claim 1, wherein the fourth interconnect level includes a metal layer having a thickness between 3 μm and 50μm.

5. The integrated circuit of claim 1, wherein a ratio of thickness between the fourth interconnection level and the first interconnection level is between 5 to 30.

6. The integrated circuit of claim 1, wherein the fourth interconnect level includes Cu.

7. The integrated circuit of claim 1, wherein a pitch between the first openings along a lateral direction corresponds to the pitch between the second openings along the same lateral direction.

8. The integrated circuit of claim 7, wherein the first openings in the third interconnect area and the second openings in the fourth interconnect area are arranged in offset patterns.

9. The integrated circuit of claim 1, wherein the first terminal is a source terminal of a FET and the second terminal is a drain terminal of the FET.

10. The integrated circuit of claim 9, wherein the FET is a lateral DMOS power transistor.

11. The integrated circuit of claim 1, wherein the first terminal is an anode terminal of a diode and the second terminal is a cathode terminal of the diode.

12. The integrated circuit of claim 4, wherein a number of the interconnect levels is four.

13. The integrated circuit of claim 1, wherein the semiconductor device is formed within a first active area of the semiconductor substrate, and wherein each one of the third and fourth interconnect areas covers at least 80% of the first active area.

14. The integrated circuit of claim 1, further comprising a plurality of dielectric interlayers including an oxide of silicon, and wherein each one of the first to third interconnection levels includes Al.

15. The integrated circuit of claim 1, wherein each one of the first contacts is electrically insulated from the third interconnect area and includes a part formed of a material of the third interconnect level, and each one of the second contacts is electrically insulated from the fourth interconnect area and includes a part formed of the material of the fourth interconnect level.

16. The integrated circuit of claim 1, wherein each one of the third and fourth interconnect areas is a continuous area.

* * * * *